United States Patent
Beeler et al.

(10) Patent No.: US 12,062,688 B2
(45) Date of Patent: Aug. 13, 2024

(54) DIELECTRIC MATERIALS, CAPACITORS AND MEMORY ARRAYS

(71) Applicant: Micron Technology, Inc., Boise, ID (US)

(72) Inventors: Richard Beeler, Boise, ID (US);
Matthew N. Rocklein, Boise, ID (US);
Timothy A. Quick, Boise, ID (US);
An-Jen B. Cheng, Boise, ID (US);
Sumeet C. Pandey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 17/236,865

(22) Filed: Apr. 21, 2021

(65) Prior Publication Data

US 2022/0344451 A1 Oct. 27, 2022

(51) Int. Cl.
*H10B 12/00* (2023.01)
*H01L 49/02* (2006.01)

(52) U.S. Cl.
CPC .............. *H01L 28/75* (2013.01); *H01L 28/40* (2013.01); *H01L 28/55* (2013.01); *H01L 28/56* (2013.01); *H10B 12/30* (2023.02)

(58) Field of Classification Search
CPC ... H01L 27/10805; H01L 28/40; H01L 28/55; H01L 28/56; H01L 28/75; H10B 12/30
See application file for complete search history.

(56) References Cited

U.S. PATENT DOCUMENTS

| | | | | |
|---|---|---|---|---|
| 2010/0255651 A1* | 10/2010 | Kang | ...................... | H01L 28/40 257/E21.24 |
| 2013/0328168 A1* | 12/2013 | Malhotra | ................ | H01L 28/60 257/532 |
| 2019/0165088 A1* | 5/2019 | Cho | .................. | H01L 21/02672 |
| 2021/0359082 A1* | 11/2021 | Kang | .................... | H01L 29/513 |

FOREIGN PATENT DOCUMENTS

| | | | | |
|---|---|---|---|---|
| CN | 208284473 U | * | 12/2018 | |
| KR | 20110004670 A | * | 1/2011 | ............. H01L 28/40 |
| KR | 20200033013 A | * | 3/2020 | ............. H01L 28/40 |

OTHER PUBLICATIONS

Hyun et al., "Field-Induced Ferroelectric Hf1?? Zr?O2 Thin Films for High-k Dynamic Random Access Memory", Advanced Electronic Materials, vol. 6, Issue 11, Oct. 2020, Germany, 10 pages.

\* cited by examiner

*Primary Examiner* — Matthew E Warren
(74) *Attorney, Agent, or Firm* — Wells St. John P.S.

(57) ABSTRACT

Some embodiments include dielectric material having a first region containing HfO and having a second region containing ZrO, where the chemical formulas indicate primary constituents rather than specific stoichiometries. The first region contains substantially no Zr, and the second region contains substantially no Hf. Some embodiments include capacitors having a first electrode, a second electrode, and a dielectric material between the first and second electrodes. The dielectric material includes one or more first regions and one or more second regions. The first region(s) contain(s) Hf (Continued)

and substantially no Zr. The second region(s) contain(s) Zr and substantially no Hf. Some embodiments include memory arrays.

76 Claims, 4 Drawing Sheets

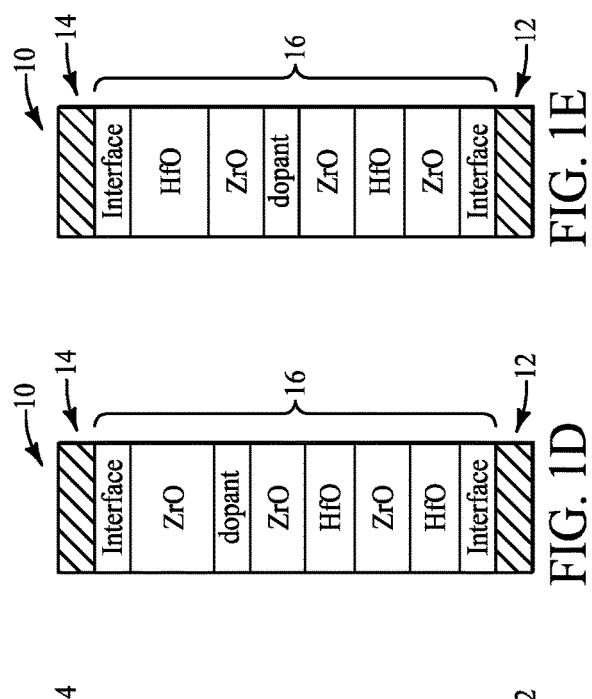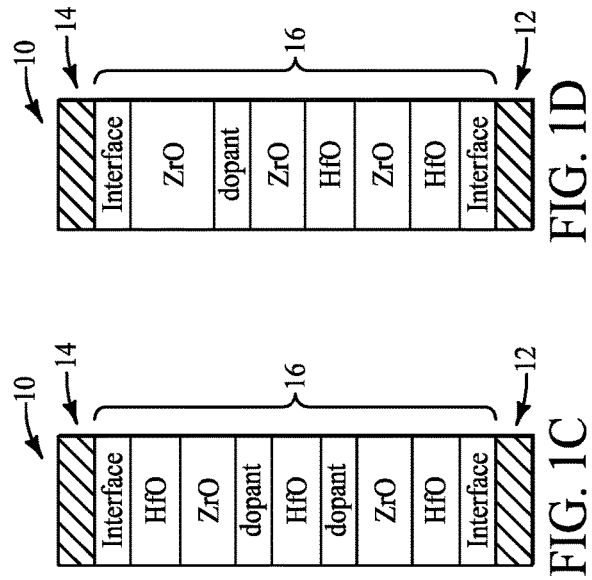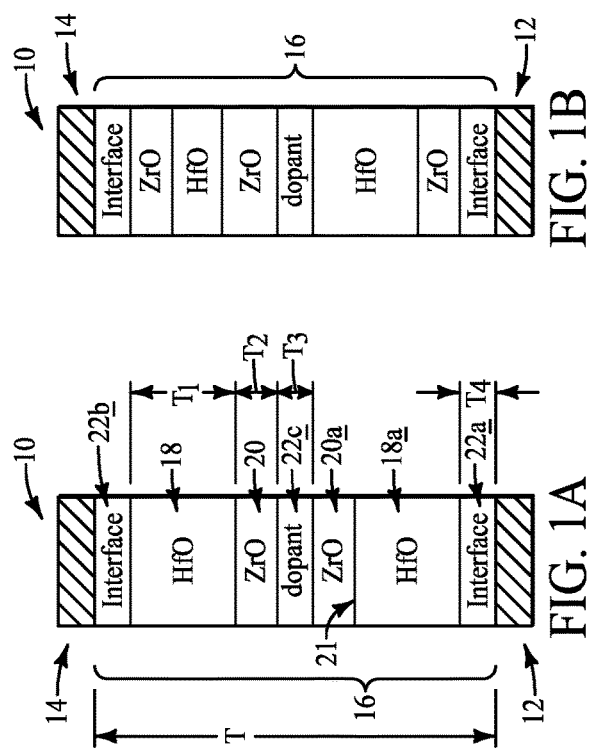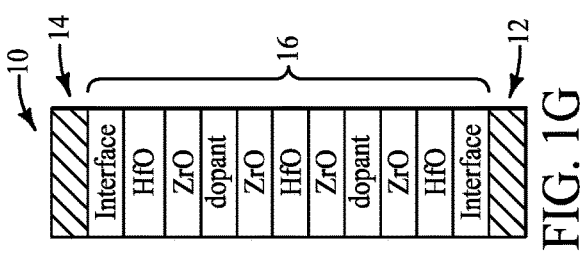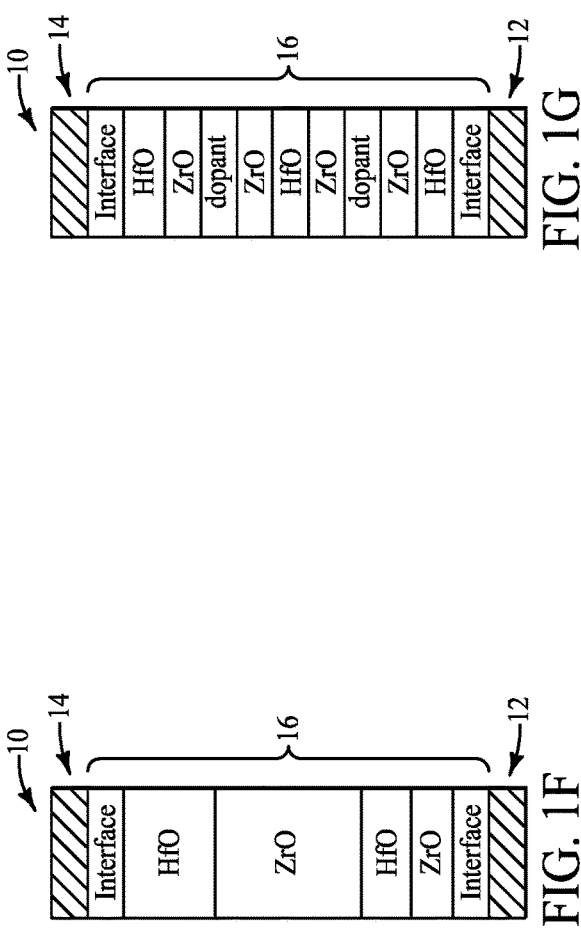

DIELECTRIC MATERIALS, CAPACITORS AND MEMORY ARRAYS

TECHNICAL FIELD

Dielectric materials. Capacitors. Memory arrays. Integrated assemblies.

BACKGROUND

Dielectric material have many uses in integrated circuitry. For instance, dielectric material may be provided between a pair of electrodes to form a capacitor. The capacitor may be utilized in memory, such as, for example, dynamic random-access memory (DRAM).

An example DRAM cell (memory cell) may include a transistor in combination with a capacitor. The transistor may be utilized to selectively access the capacitor, and may be referred to as an access device. The capacitor may electrostatically store energy as an electric field within the capacitor dielectric. The electrical state of the capacitor may be utilized to represent a memory state.

A DRAM array (memory array) may include a large number of the memory cells. The memory cells may be written to, or read from, using digit lines (which may also be referred to as bitlines, data lines, sense lines, or data/sense lines) and access lines (which may also be referred to as wordlines). The digit lines may extend along columns of the array, and the access lines may extend along rows of the array. Each memory cell may be uniquely addressed through the combination of a digit line and an access line.

It is desired to develop improved dielectric materials, and to develop improved devices (e.g., memory cells) utilizing the improved dielectric materials.

BRIEF DESCRIPTION OF THE DRAWINGS

FIGS. 1A-1G are diagrammatic cross-sectional side views of example regions of example capacitors.

DETAILED DESCRIPTION OF THE ILLUSTRATED EMBODIMENTS

Figures 2A, 2B:
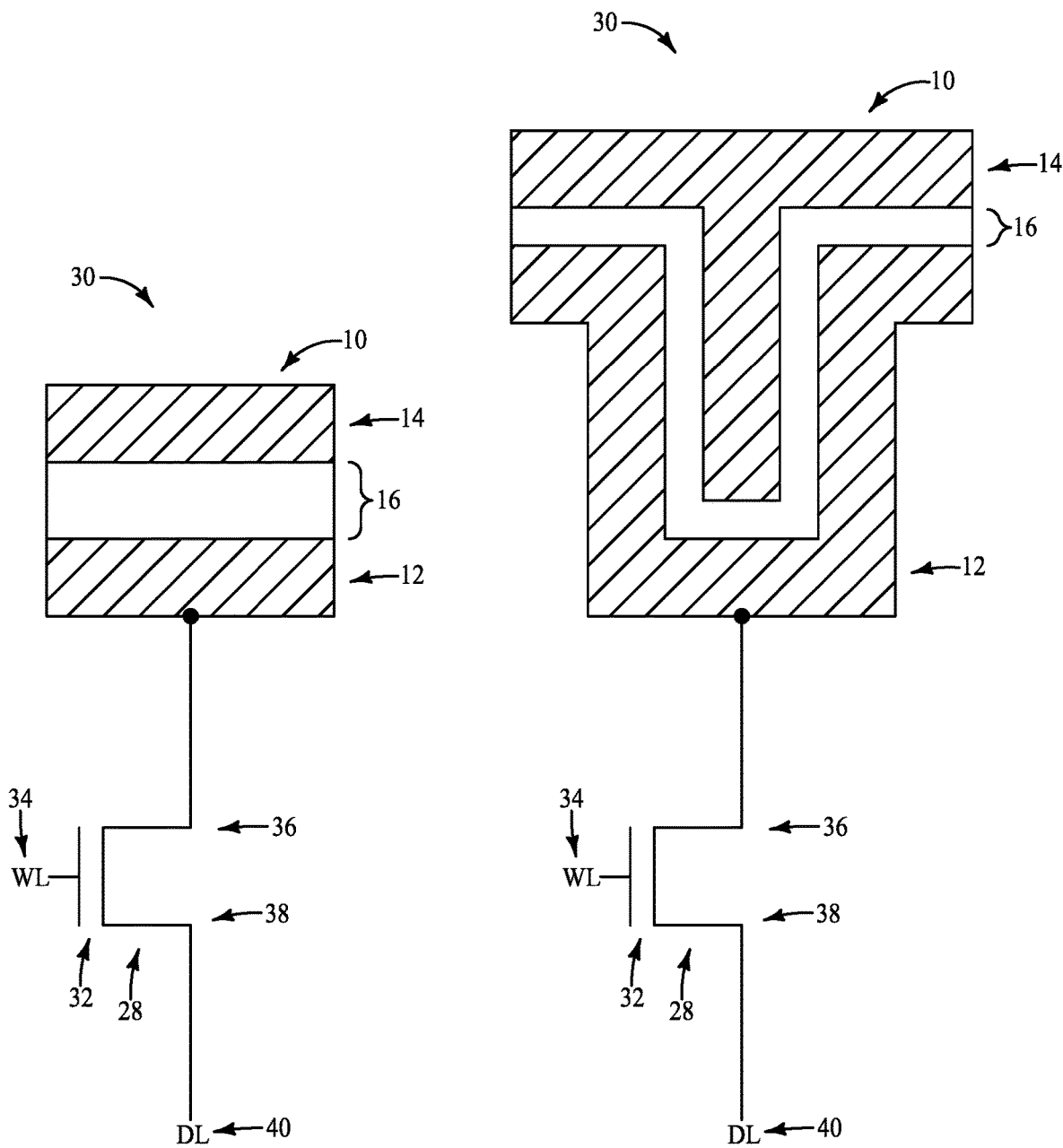
FIGS. 2A-2C are diagrammatic views of example regions of example memory cells comprising example capacitors.

Some embodiments include dielectric materials having one or more regions containing $HfO_x$ (where x is a number) and no detectable Zr, and one or more regions containing $ZrO_y$ (where y is a number) and no detectable Hf. The dielectric materials may be utilized in capacitors, and the capacitors may be utilized in memory arrays. Example embodiments are described with reference to FIGS. 1-3.

Referring to FIG. 1A, a portion of an example capacitor 10 is shown. The capacitor comprises a first electrode 12, a second electrode 14, and a dielectric material 16 between the first and second electrodes.

The first and second electrodes 12 and 14 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second electrodes may comprise a same composition as one another, or may comprise different compositions relative to one another.

The dielectric material 16 includes insulative first regions (blocks, layers, films, etc.) 18 comprising HfO, and includes insulative second regions (blocks, layers, films, etc.) 20 comprising ZrO. The chemical formulas HfO and ZrO are utilized to indicate primary constituents rather than specific stoichiometries (with Hf, Zr and O corresponding to hafnium, zirconium and oxygen, respectively). The material HfO may be $HfO_2$, or more generally may be $HfO_x$, where x is a number. The material ZrO may be $ZrO_2$, or more generally may be $ZrO_y$, where y is a number.

The first regions 18 may be referred to as Hf-containing regions, and the second regions 20 may be referred to as Zr-containing regions. The Hf-containing regions 18 may comprise substantially no Zr (or in some embodiments, absolutely no Zr), and the Zr-containing regions 20 may comprise substantially no Hf (or in some embodiments, absolutely no Hf). A region may be considered to comprise substantially none of a specified element if the amount of such element is effectively 0 atomic percent to within reasonable tolerances of fabrication and measurement (detection). In some embodiments, the hafnium-containing regions 18 may be considered to comprise, consist essentially of, or consist of HfO, and the zirconium-containing regions 20 may be considered to comprise, consist essentially of, or consist of ZrO. Unless specified otherwise, the chemical formulas HfO and ZrO utilized herein are to be understood as referring to primary constituents rather than specific stoichiometries.

The illustrated dielectric material 16 of FIG. 1A comprises two of the first regions 18 and two of the second regions 20. Generally, the dielectric material will comprise at least one of the first regions 18 and at least one of the second regions 20. In some embodiments, the regions 18 and 20 may be considered to be primary regions of the dielectric material 16. The dielectric material may comprise a total number of such primary regions within a range of from about 2 to about 10, within a range of from about 2 to about 8, within a range of from about 2 to about 5, etc.

One of the regions 20 of FIG. 1A is labeled 20a, and one of the regions 18 is labeled 18a. The regions 20a and 18a are directly adjacent to one another along an interface 21. In some embodiments, such interface may correspond to an abrupt boundary such that there is effectively no intermixing of hafnium from the layer 18a and zirconium from the layer 20a across the boundary. To the extent that there is any apparent mixing along the interface, such may result solely (or at least substantially entirely) from roughness of the edges of the regions 18a and 20a along such interface. In other embodiments, the interface 21 may include a boundary region between the zirconium-containing material of the block 20a and the hafnium-containing material of the block 18a. Such boundary region may include both hafnium and zirconium (i.e., may comprise intermixed hafnium and zirconium). Generally, the boundary region, if present, will be very thin (e.g., less than or equal to about 5 Å thick, less than or equal to about 3 Å thick, etc.).

The dielectric material 16 is shown to comprise additional regions (blocks, layers, films, etc.) 22a-c, in addition to the regions 18 and 20. The regions 22a-c may be referred to as insulative third regions, and may comprise one or more insulative compositions (e.g., insulative oxides). In some embodiments, the third regions may include oxygen in combination with one or more of Al (aluminum), Y (yttrium), La (lanthanum), Si (silicon), Ge (germanium), Zr (zirconium), Hf (hafnium), Sr (strontium), Mg (magnesium), Ca (calcium), Ce (cerium), Pr (praseodymium), Nb (niobium) and Ti (titanium). In some embodiments, the third regions may include oxygen in combination with one or more elements of the lanthanide series (i.e., the elements 57-71 of the periodic table). The regions 22a-c may comprise a same composition as one another, or at least one of the regions may comprise a different composition than at least one other of the regions.

The regions 22a and 22b are labeled as "interface" regions to indicate that such regions are interfaces along the electrodes 12 and 14, respectively. The interface regions may be utilized as barriers to alleviate or preclude undesired oxidation of the conductive materials of the electrodes 12 and 14 that may otherwise occur if one of the regions 18 and 20 is directly against the conductive material of such electrodes. Additionally, or alternatively, the regions 22a and 22b may improve crystallization of the dielectric material 16 along surfaces of the electrodes 12 and 14 relative to crystallization which would occur if regions 18 and 20 were directly against surfaces of such electrodes, and/or may improve adhesion of the dielectric material 16 to the electrodes 12 and 14 as compared to embodiments in which regions 18 and 20 are directly against surfaces of such electrodes.

The region 22c is labeled "dopant" and may be provided to enable properties of the dielectric material 16 to be tailored for particular applications. Such properties may include, for example, leakage properties, capacitance-voltage hysteresis properties, etc. In some embodiments, suitable dopants may be dispersed throughout one or more of the regions 18 and 20, in addition to, or alternatively to, utilizing the dopant region 22c. It is noted that the oxides described above as being suitable for utilization in the dopant region 22c include zirconium oxide and hafnium oxide. Such may be an advantage of utilizing the separate region 22c for provision of the dopants in that it enables a region of the dielectric material 16 to include a dopant region 22c containing a mixture of hafnium oxide and zirconium oxide, while the dielectric material 16 has other regions corresponding to the hafnium-containing regions 18 lacking Zr and the zirconium-containing regions 20 lacking Hf.

The illustrated regions 22a-c are optional regions, and one or more of such regions may be omitted in some embodiments. Also, although only one dopant region 22c is illustrated in FIG. 1A, in other embodiments there may be two or more of such dopant regions.

The dielectric material 16 may have any suitable thickness T. In some embodiments, such thickness may be within a range of from about 40 Å to about 400 Å, within a range of from about 40 Å to about 100 Å, within a range of from about 30 Å to about 60 Å, within a range of from about 40 Å to about 60 Å, etc.

The blocks 18 and 20 may have any suitable thicknesses $T_1$ and $T_2$, and in some embodiments such thicknesses may be within a range of from about 5 Å to about 50 Å, within a range of from about 5 Å to about 40 Å, within a range of from about 5 Å to about 30 Å, etc. The blocks 18 may all have about the same thickness as one another, or may have different thicknesses relative to one another. Similarly, the blocks 20 may all have about the same thickness as one another, or may have different thicknesses relative to one another. Also, one or more of the blocks 20 may have about the same thickness as one or more of the blocks 18, or may have a different thickness than one or more of the blocks 18.

In some embodiments, the thickness T may be considered to be a total thickness of the dielectric material 16 between the first and second electrodes 12 and 14. The first regions 18 (the hafnium-containing regions) may comprise from about 15% to about 55% of such total thickness, by volume; may comprise from about 15% to about 25% of such total thickness, by volume; etc. The second regions 20 (the zirconium-containing regions) may comprise from about 40% to about 90% of such total thickness, by volume; from about 40% to about 80% of such total thickness, by volume; etc. In some embodiments, the zirconium-containing regions 20 comprise a greater percentage of the total thickness T of the dielectric material 16, by volume, than the hafnium-containing regions 18.

The interface regions 22a and 22b may comprise any suitable thicknesses, with an example thickness $T_4$ being shown relative to the layer 22a. The interface regions 22a and 22b may comprise the same thickness as one another or may comprise different thicknesses relative to one another. In some embodiments, the thickness $T_4$ may be less than or equal to about 6 Å. The layers 22a and 22b may be continuous, and thus may have a minimum thickness corresponding to a monolayer. Alternatively, at least one of the layers 22a and 22b may be discontinuous.

The dopant layer 22c may comprise any suitable thickness $T_3$, and in some embodiments may comprise a thickness of less than or equal to about 6 Å. The layer 22c may be continuous, and thus may have a minimum thickness corresponding to a monolayer. Alternatively, the layer 22c may be discontinuous.

There may be numerous advantages to forming the dielectric material 16 to comprise the discrete blocks of HfO-containing regions 18 and ZrO-containing regions 20. For instance, properties (e.g., leakage properties, capacitance-voltage hysteresis properties, etc.) may be tailored by modifying the size and number of the blocks 18 and 20 within the dielectric material 16. Further, in some embodiments the dielectric material 16 may be configured (i.e., engineered) to achieve a selected criterion, such as, for example, an equivalent oxide thickness (EOT). The EOT quantifies the electrical properties of the dielectric material 16 in terms of a representative physical thickness. For example, EOT may be defined as the thickness of a theoretical silicon dioxide layer that would be required to have the same capacitance density as a given dielectric 16, ignoring leakage current and reliability considerations. In some embodiments, the size and number of blocks 18 and 20 within the dielectric material 16 may be tailored to achieve a desired EOT. In some embodiments, the EOT attainable utilizing the discrete HfO-containing blocks 18 and ZrO-containing blocks 20 of embodiments described herein may be better than that attainable utilizing a conventional dielectric material, meaning that the dielectric material 16 may be formed thinner than a conventional dielectric material (e.g., a dielectric material containing a mixture of HfO and ZrO throughout the material) while still achieving the same, or better, EOT.

The blocks 18 and 20 may be formed from Hf and Zr, respectively, deposited with suitable conditions (e.g., atomic layer deposition), and then oxidized with one or more suitable oxidants (e.g., ozone). It is found that the Hf and Zr of the blocks 18 and 20 may be fully oxidized and crystallized at a lower temperature than would blocks comprising mixed HfO and ZrO. Accordingly, in some embodiments capacitors described herein (e.g., the capacitor 10 of FIG. 1A) may be formed with processing that includes no temperature over about 600° C., no temperature over about 430° C., no temperature over about 400° C., etc. Such may advantageously reduce process temperatures as compared to conventional methods of forming capacitors (e.g., methods of forming capacitors in which the dielectric material comprises mixed HfO and ZrO throughout the dielectric material).

FIG. 1A shows a representative capacitor configuration 10 utilizing the discrete HfO-containing blocks 18 and ZrO-containing blocks 20. FIGS. 1B-1G show other representative capacitor configurations. The configurations may comprise more than one of the dopant layers (as shown in FIGS. 1C and 1G). The configurations may comprise the dopant layers either centrally located within the dielectric material 16 (as shown in FIGS. 1A, 1B and 1E), or offset from being centrally located (as shown in FIGS. 1C, 1D and 1G). The dielectric material 16 may be symmetric between the electrodes 12 and 14 (as shown in FIGS. 1A, 1C, and 1G), or may be asymmetric between the electrodes (as shown in FIGS. 1B, 1D, 1E and 1F). Dopant may be provided in individual dopant layers in addition to the interface layers (as shown in FIGS. 1A, 1B, 1C, 1D, 1E and 1G), or not (as shown in FIG. 1F). The embodiment of FIG. 1F may or may not comprise suitable dopant dispersed throughout the HfO-containing layers and the ZrO-containing layers.

The capacitors described above may comprise any suitable three-dimensional configurations. For instance, FIG. 2A shows a cross-sectional side view of an example configuration of a capacitor 10 in which the electrodes 12 and 14 each have a planar configuration, and in which the dielectric material 16 is provided between the planar electrodes 12 and 14. The capacitor 10 of FIG. 2A may be considered to be an example of a planar-capacitor configuration. The dielectric material 16 of FIG. 2A may comprise any of the example embodiments of FIGS. 1A-1G, or any other suitable embodiment having HfO-containing blocks 18 and ZrO-containing blocks 20 of the types described above with reference to FIG. 1A.

As another example, FIG. 2B shows a cross-sectional side view of an example configuration of a capacitor 10 in which the electrode 12 is container-shaped, and in which the dielectric material 16 and electrode 14 extend into such container shape. The capacitor 10 of FIG. 2B may be considered to be an example of a container-shaped capacitor configuration. The dielectric material 16 of FIG. 2B may comprise any of the example embodiments of FIGS. 1A-1G, or any other suitable embodiment having HfO-containing blocks 18 and ZrO-containing blocks 20 of the types described above with reference to FIG. 1A.

Figure 2C:
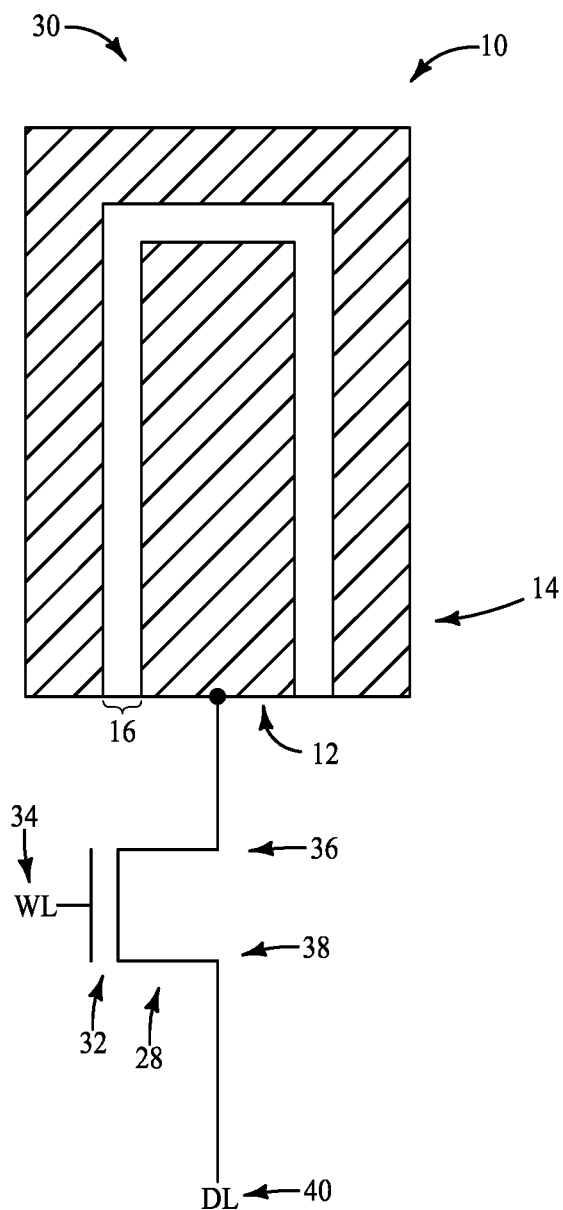

FIG. 2C shows another example configuration of a capacitor 10. The example capacitor of FIG. 2C has the electrode 12 configured as a pillar. The dielectric material 16 and the electrode 14 extend around an outer surface of such pillar. The capacitor 10 of FIG. 2C may be considered to be an example of a pillar-based capacitor configuration. The dielectric material 16 of FIG. 2C may comprise any of the example embodiments of FIGS. 1A-1G, or any other suitable embodiment having HfO-containing blocks 18 and ZrO-containing blocks 20 of the types described above with reference to FIG. 1A.

The capacitors 10 of FIGS. 2A-2C are shown to be incorporated into memory cells 30, with such memory cells comprising the capacitors 10 coupled with access devices 28. In the shown embodiment, the access devices correspond to transistors. In other embodiments, the access devices may have other suitable configurations (e.g., may correspond to ovonic threshold switches, diodes, etc.).

The access devices 28 are shown to have gates 32 coupled with wordlines 34, to have first source/drain regions 36 coupled with the capacitors 10, and to have second source/drain regions 38 coupled with digit lines 40.

Figure 3:
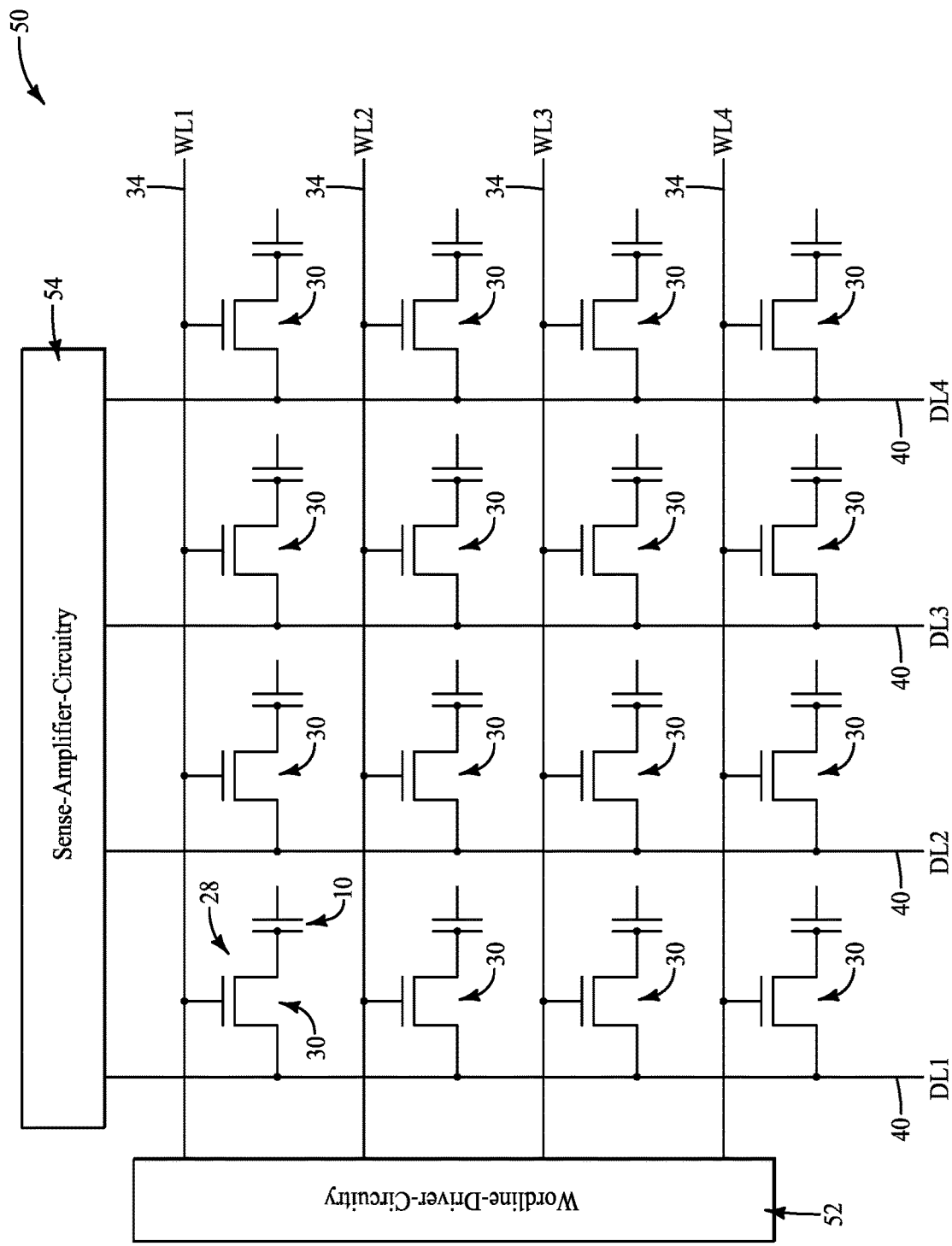
FIG. 3 is a diagrammatic schematic view of an example region of an example memory array.

The memory cells 30 may be provided within a memory array (e.g., a DRAM array), with an example array 50 being shown in FIG. 3. The memory array includes a plurality of the wordlines 34 (labeled as WL1-WL4), with such wordlines being coupled with wordline-driver-circuitry 52. The memory array also includes a plurality of the digit lines 40 (labeled DL1-DL4), with such digit lines being coupled with sense-amplifier-circuitry 54. The memory array includes a plurality of the memory cells 30, with the individual memory cells each comprising a capacitor 10 coupled with an access device 28.

Each of the memory cells 30 is uniquely addressed by one of the wordlines 34 in combination with one of the digit lines 40.

The illustrated region of the memory array 50 may be considered to be a representative portion of the memory array. In practice, the memory array may comprise hundreds, thousands, hundreds of thousands, millions, hundreds of millions, etc., of the memory cells 30. The memory cells may be substantially identical to one another, with the term "substantially identical" meaning identical to within reasonable tolerances of fabrication and measurement.

Although the dielectric material 16 described herein is specifically described as being utilized within capacitor configurations, it is to be understood that such dielectric material may be utilized within any suitable components. For instance, in some embodiments the dielectric material 16 may be incorporated into transistors as gate dielectric material, may be incorporated into sensors, etc.

The structures described above with reference to FIGS. 1-3 may be supported by an underlying base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a dielectric material having a first region containing HfO and having a second region containing ZrO, where the chemical formulas indicate primary constituents rather than specific stoichiometries. The first region contains substantially no Zr, and the second region contains substantially no Hf.

Some embodiments include a capacitor having a first electrode, a second electrode, and a dielectric material between the first and second electrodes. The dielectric material includes one or more insulative first regions and one or more insulative second regions. The one or more insulative first regions contain Hf and substantially no Zr. The one or more insulative second regions contain Zr and substantially no Hf.

Some embodiments include a memory array comprising memory cells. Each of the memory cells has an access device coupled with a capacitor. Each of the capacitors comprises a dielectric material between a pair of electrodes, with the dielectric material comprising a stack of insulative layers. Some of the insulative layers within the stack are Hf-containing layers which comprise substantially no Zr, and some of the insulative layers within the stack are Zr-containing layers which comprise substantially no Hf.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A dielectric material comprising a first region containing HfO and comprising a second region containing ZrO, where the chemical formulas indicate primary constituents rather than specific stoichiometries; the first region containing substantially no Zr, and the second region containing substantially no Hf; and wherein the first and second regions are primary regions of the dielectric material; and wherein said dielectric material comprises a total number of the primary regions within a range of from 3 to about 10; and a boundary region between the first and second regions and being a separate and discrete structure from the first and second regions, and wherein the boundary region includes both Hf and Zr.

2. The dielectric material of claim 1 wherein the first and second regions have first and second thicknesses, respectively; with said first and second thicknesses being within a range of from 5 Å to about 50 Å.

3. The dielectric material of claim 2 wherein the first and second thicknesses are about the same as one another.

4. The dielectric material of claim 1 wherein the first and second regions have first and second thicknesses, respectively; wherein the first and second thicknesses are different from one another.

5. The dielectric material of claim 1 further comprising at least one dopant layer which is a separate and discrete layer in between, and in addition to, the first and second regions, and which includes one or more oxides.

6. The dielectric material of claim 5 wherein said one or more oxides include one or more of Al, Y, La, Si, Ge, Zr, Hf, Sr, Mg, Ca, Ce, Pr, Nb and Ti.

7. The dielectric material of claim 5 wherein said one or more oxides include one or more of elements of the lanthanide series.

8. The dielectric material of claim 5 wherein said at least one dopant layer has a thickness of less than or equal to about 6 Å.

9. The dielectric material of claim 1 wherein the substantially no Zr comprises absolutely no Zr.

10. The dielectric material of claim 1 wherein the substantially no Hf comprises absolutely no Hf.

11. The dielectric material of claim 1 wherein the substantially no Zr comprises an amount of Zr that is effectively 0 atomic percent to within reasonable tolerances of fabrication and measurement.

12. The dielectric material of claim 1 wherein the substantially no Hf comprises an amount of Hf that is effectively 0 atomic percent to within reasonable tolerances of fabrication and measurement.

13. The dielectric material of claim 1 wherein the dielectric material comprises either at least two of the first regions or at least two of the second regions.

14. The dielectric material of claim 1 wherein the dielectric material comprises at least two of the first regions and at least two of the second regions.

15. The dielectric material of claim 1 further comprising dopant dispersed throughout one or more of the first and second regions.

16. The dielectric material of claim 1 further comprising two dopant layers.

17. The dielectric material of claim 1 further comprising a dopant layer and an interface layer.

18. The dielectric material of claim 1 further comprising an interface layer comprising a monolayer.

19. The dielectric material of claim 1 further comprising a dopant layer comprising a monolayer.

20. The dielectric material of claim 1 further comprising:
a dopant layer in the first region; and
a crystallization layer in the first region.

21. The dielectric material of claim 20 further comprising:
a dopant layer in the second region; and
a crystallization layer in the second region.

22. A capacitor comprising:
a first electrode;
a second electrode; and
a dielectric material between the first and second electrodes; the dielectric material comprising one or more insulative first regions and one or more insulative second regions; with said one or more insulative first regions comprising Hf and substantially no Zr, and with said one or more insulative second regions comprising Zr and substantially no Hf; and
wherein the dielectric material comprises either at least two of the insulative first regions or at least two of the insulative second regions; and
at least one dopant layer which is a separate and discrete layer in between, and in addition to, the first and second regions, and which includes one or more oxides.

23. The capacitor of claim 22 wherein the one or more insulative first regions consist essentially of HO, where the chemical formula indicates primary constituents rather than a specific stoichiometry.

24. The capacitor of claim 22 wherein the one or more insulative first regions consist of HfO, where the chemical formula indicates primary constituents rather than a specific stoichiometry.

25. The capacitor of claim 22 wherein the one or more insulative second regions consist essentially of ZrO, where the chemical formula indicates primary constituents rather than a specific stoichiometry.

26. The capacitor of claim 22 wherein the one or more insulative second regions consist of ZrO, where the chemical formula indicates primary constituents rather than a specific stoichiometry.

27. The capacitor of claim 22 wherein the dielectric material has a total thickness between the first and second electrodes within a range of from about 40 Å to about 400 Å.

28. The capacitor of claim 22 wherein the dielectric material has a total thickness between the first and second electrodes within a range of from about 30 Å to about 60 Å.

29. The capacitor of claim 22 wherein the dielectric material has a total thickness between the first and second electrodes within a range of from about 40 Å to about 100 Å.

30. The capacitor of claim 22 wherein the dielectric material has a total thickness between the first and second electrodes; and wherein the one or more insulative first regions comprise from about 15% to about 25% of said total thickness, by volume.

31. The capacitor of claim 22 wherein the dielectric material has a total thickness between the first and second electrodes; and wherein the one or more insulative first regions comprise from about 15% to about 55% of said total thickness, by volume.

32. The capacitor of claim 22 wherein the dielectric material has a total thickness between the first and second electrodes; and wherein the one or more insulative second regions comprise from about 40% to about 80% of said total thickness, by volume.

33. The capacitor of claim 22 wherein the dielectric material has a total thickness between the first and second electrodes; and wherein the one or more insulative second regions comprise a greater content of the total thickness, by volume, than the one or more insulative first regions.

34. The capacitor of claim 22 wherein the dielectric material comprises one or more insulative third regions; with said one or more insulative third regions including one or more oxides which include one or more elements of the lanthanide series.

35. The capacitor of claim 22 wherein the dielectric material comprises one or more insulative third regions; with said one or more insulative third regions including one or more oxides which include one or more of Al, Y, La, Si, Ge, Zr, Hf, Sr, Mg, Ca, Ce, Pr, Nb and Ti.

36. The capacitor of claim 35 wherein at least one of said one or more insulative third regions is continuous.

37. The capacitor of claim 35 wherein at least one of said one or more insulative third regions is discontinuous.

38. The capacitor of claim 22 formed with a process that includes no temperature over about 600° C.

39. The capacitor of claim 22 formed with a process that includes no temperature over about 430° C.

40. The capacitor of claim 22 formed with a process that includes no temperature over about 400° C.

41. The capacitor of claim 22 further comprising:
a first interface layer between the dielectric material and the first electrode; and
a second interface layer between the dielectric material and the second electrode.

42. The capacitor of claim 41 wherein the first and second interface layers include one or more oxides.

43. The capacitor of claim 42 wherein said one or more oxides include one or more of Al, Y, La, Si, Ge, Zr, Hf, Sr, Mg, Ca, Ce, Pr, Nb and Ti.

44. The capacitor of claim 42 wherein said one or more oxides include one or more of elements of the lanthanide series.

45. The capacitor of claim 22 wherein the substantially no Zr comprises absolutely no Zr.

46. The capacitor of claim 22 wherein the substantially no Hf comprises absolutely no Hf.

47. The capacitor of claim 22 wherein the substantially no Zr comprises an amount of Zr that is effectively 0 atomic percent to within reasonable tolerances of fabrication and measurement.

48. The capacitor of claim 22 wherein the substantially no Hf comprises an amount of Hf that is effectively 0 atomic percent to within reasonable tolerances of fabrication and measurement.

49. The capacitor of claim 22 wherein the dielectric material comprises at least two of the insulative first regions and at least two of the insulative second regions.

50. The capacitor of claim 22 further comprising dopant dispersed throughout one or more of the first and second regions.

51. The capacitor of claim 22 further comprising an interface layer comprising a monolayer.

52. The capacitor of claim 22 further comprising a dopant layer comprising a monolayer.

53. The dielectric material of claim 22 further comprising:
a dopant layer in the insulative first region; and
a crystallization layer in the insulative first region.

54. The dielectric material of claim 53 further comprising:
a dopant layer in the insulative second region; and
a crystallization layer in the insulative second region.

55. A memory array comprising memory cells, each of the memory cells comprising an access device coupled with a capacitor; each of the capacitors comprising a dielectric material between a pair of electrodes, with the dielectric material comprising a stack of insulative layers; some of the insulative layers within said stack being Hf-containing layers which comprise substantially no Zr, and some of the insulative layers within said stack being Zr-containing layers which comprise substantially no Hf;
wherein the dielectric material comprises either at least two of the Hf-containing layers or at least two of the Zr-containing layers; and
a boundary region between two insulative layers of the stack and being a separate and discrete structure from the two insulative layers, and wherein the boundary region includes both Hf and Zr.

56. The memory array of claim 55 wherein the stack includes dopant distributed throughout the Hf-containing layers and the Zr-containing layers.

57. The memory array of claim 56 wherein the dopant includes one or more of Al, Y, La, Si, Ge, Zr, Hf, Sr, Mg, Ca, Ce, Pr, Nb and Ti.

58. The memory array of claim 55 wherein the stack includes one or more dopant layers.

59. The memory array of claim 58 wherein said one or more dopant layers include oxygen in combination with one or more of Al, Y, La, Si, Ge, Zr, Hf, Sr, Mg, Ca, Ce, Pr, Nb and Ti.

60. The memory array of claim 58 wherein said one or more dopant layers include oxygen in combination with one or more of elements of the lanthanide series.

61. The memory array of claim 55 wherein the stack includes a first interfacial layer along one of the electrodes of said pair of electrodes, and includes a second interfacial layer along the other of the electrodes of said pair of electrodes; and wherein the first and second interfacial layers include oxygen in combination with one or more of Al, Y, La, Si, Ge, Zr, Hf, Sr, Mg, Ca, Ce, Pr, Nb and Ti.

62. The memory array of claim 55 wherein one of the Hf-containing layers is directly adjacent to one of the Zr-containing layers; wherein a boundary is between said one of the Hf-containing layers and said one of the Zr-containing layers; and wherein there is substantially no intermixing of Hf and Zr along said boundary.

63. The memory array of claim 55 wherein the substantially no Zr comprises absolutely no Zr.

64. The memory array of claim 55 wherein the substantially no Hf comprises absolutely no Hf.

65. The memory array of claim 55 wherein the substantially no Zr comprises an amount of Zr that is effectively 0 atomic percent to within reasonable tolerances of fabrication and measurement.

66. The memory array of claim 55 wherein the substantially no Hf comprises an amount of Hf that is effectively 0 atomic percent to within reasonable tolerances of fabrication and measurement.

67. The memory array of claim 55 wherein the dielectric material comprises at least two of the Hf-containing layers and at least two of the Zr-containing layers.

68. The memory array of claim 55 further comprising dopant dispersed throughout one or more of the insulative layers.

69. The memory array of claim 55 wherein the dielectric material further comprises a dopant layer and an interface layer.

70. The memory array of claim 55 further comprising a dopant layer comprising a monolayer.

71. The dielectric material of claim 55 further comprising:
a dopant layer in one of the Hf-containing layers; and
a crystallization layer in the one of the Hf-containing layers.

72. The dielectric material of claim 71 further comprising:
a dopant layer in one of the Zr-containing layers; and
a crystallization layer in the one of the Zr-containing layers.

73. A dielectric material comprising a first region containing HfO and comprising a second region containing ZrO, where the chemical formulas indicate primary constituents rather than specific stoichiometries; the first region containing substantially no Zr, and the second region containing substantially no Hf; and
wherein the first and second regions are primary regions of the dielectric material; and wherein said dielectric material comprises a total number of the primary regions within a range of from 3 to about 10; and
at least one dopant layer which is a separate and discrete layer in between, and in addition to, the first and second regions, and which includes one or more oxides.

74. The dielectric material of claim 73 wherein said one or more oxides include one or more of Al, Y, La, Si, Ge, Zr, Hf, Sr, Mg, Ca, Ce, Pr, Nb and Ti.

75. The dielectric material of claim 73 wherein said one or more oxides include one or more of elements of the lanthanide series.

76. The dielectric material of claim 73 wherein said at least one dopant layer has a thickness of less than or equal to about 6 Å.

* * * * *